(12) United States Patent
Nishimoto et al.

(10) Patent No.: US 6,798,519 B2
(45) Date of Patent: Sep. 28, 2004

(54) METHOD AND APPARATUS FOR AN IMPROVED OPTICAL WINDOW DEPOSITION SHIELD IN A PLASMA PROCESSING SYSTEM

(75) Inventors: Shinya Nishimoto, Nirasaki (JP); Kouji Mitsuhashi, Nirasaki (JP); Hidehito Saigusa, Nirasaki (JP); Taira Takase, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 75 days.

(21) Appl. No.: 10/259,352

(22) Filed: Sep. 30, 2002

(65) Prior Publication Data

US 2004/0060516 A1 Apr. 1, 2004

(51) Int. Cl.[7] .............................................. G01N 21/23
(52) U.S. Cl. ...................................................... 356/419
(58) Field of Search ................................ 356/419, 328, 356/71; 250/226

(56) References Cited

U.S. PATENT DOCUMENTS

| | | | | |
|---|---|---|---|---|
| 6,246,479 B1 | * | 6/2001 | Jung et al. | 356/419 |
| 6,373,573 B1 | * | 4/2002 | Jung et al. | 356/419 |
| 6,519,037 B2 | * | 2/2003 | Jung et al. | 356/419 |
| 6,570,654 B2 | * | 5/2003 | Jung et al. | 356/419 |
| 6,590,660 B2 | * | 7/2003 | Jung et al. | 356/419 |

* cited by examiner

*Primary Examiner*—John F. Niebling
*Assistant Examiner*—Andre' Stevenson
(74) *Attorney, Agent, or Firm*—Oblon, Spivak, McClelland, Maier & Neustadt, P.C.

(57) ABSTRACT

The present invention presents an improved optical window deposition shield an improved optical window deposition shield for optical access to a process space in a plasma processing system through a deposition shield, wherein the design and fabrication of the optical window deposition shield advantageously provides an optically clean access to the processing plasma in the process space while sustaining substantially minimal erosion of the optical window deposition shield.

40 Claims, 10 Drawing Sheets

METHOD AND APPARATUS FOR AN IMPROVED OPTICAL WINDOW DEPOSITION SHIELD IN A PLASMA PROCESSING SYSTEM

CROSS-REFERENCE TO RELATED APPLICATIONS

This application is related to co-pending U.S. patent application Ser. No. 10/259,858, entitled "Method and apparatus for an improved upper electrode plate with deposition shield in a plasma processing system", filed on even date herewith; co-pending U.S. patent application Ser. No. 10/259,382, entitled "Method and apparatus for an improved baffle plate in a plasma processing system", filed on even date herewith; co-pending U.S. patent application Ser. No. 10/259,380, entitled "Method and apparatus for an improved baffle plate in a plasma processing system", filed on even date herewith; co-pending U.S. patent application Ser. No. 10/259,353, entitled "Method and apparatus for an improved deposition shield in a plasma processing system", filed on even date herewith; co-pending U.S. patent application Ser. No. 10/259,757, entitled "Method and apparatus for an improved upper electrode plate in a plasma processing system", filed on even date herewith; and co-pending U.S. patent application Ser. No. 10/259,306, entitled "Method and apparatus for an improved bellows shield in a plasma processing system", filed on even date herewith. The entire contents of all of those applications are herein incorporated by reference in their entirety.

FIELD OF THE INVENTION

The present invention relates to an improved component for a plasma processing system and, more particularly, to an optical window deposition shield employed in a plasma processing system to provide optical access to a process space through a deposition shield.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

The present invention provides an improved optical window deposition shield for optical access to a process space in a plasma processing system through a deposition shield, wherein the design and fabrication of the optical window deposition shield advantageously addresses the above-identifed shortcomings.

It is an object of the present invention to provide an optical window deposition shield comprising a plug configured to extend through an opening formed in the deposition shield, a flange coupled to the plug and configured to attach the optical window deposition shield to the deposition shield. The plug comprises a frontal surface and a perimeter surface coupled thereto. The flange comprises a first surface, a second surface, and an edge surface, wherein the first surface further comprises a mating surface.

It is another object of the present invention that the optical window deposition shield comprises at least one optical through-hole coupled to the frontal surface of the plug and the second surface of the flange and configured to permit the passage of light, wherein such an optical through-hole can comprise an exposed entrant surface coupled to the frontal surface of the plug, and an interior through-hole surface coupled to the exposed entrant surface and to the second surface of the flange.

It is another object of the present invention that the optical window deposition shield comprises a plurality of fastening receptors coupled to the mating surface of the first surface of the flange and the second surface of the flange and configured to receive fastening devices, wherein each fastening receptor can comprise an entrant region, a through-hole region, an exit through-hole, an interior fastener surface, and a recessed fastener surface.

It is another object of the present invention that the optical window deposition shield further comprises a protective barrier formed on a plurality of exposed surfaces of the optical window deposition shield exposed to the processing plasma.

It is a further object of the present invention that the exposed surfaces of the deposition shield comprise the frontal surface of the plug, the perimeter surface of the plug, the first surface of the flange excluding the mating surface, and the exposed entrant surface of the at least one optical through-hole.

The present invention further provides a method of producing the optical window deposition shield in the plasma processing system comprising the steps: fabricating the optical window deposition shield; anodizing the optical window deposition shield to form a surface anodization layer on the optical window deposition shield; machining the exposed surfaces on the optical window deposition shield to remove the surface anodization layer; and forming a protective barrier on the exposed surfaces.

The present invention provides another method of producing the optical window deposition shield in the plasma processing system comprising the steps: fabricating the optical window deposition shield; masking the exposed surfaces on the optical window deposition shield to prevent formation of a surface anodization layer; anodizing the optical window deposition shield to form the surface anodization layer on the optical window deposition shield; unmasking the exposed surfaces; and forming a protective barrier on the exposed surfaces.

The present invention provides another method of producing the optical window deposition shield in the plasma processing system comprising the steps: fabricating the optical window deposition shield; and forming a protective barrier on exposed surfaces.

The present invention also includes another method that combines masking portions of the exposed surfaces before anodization and leaving other portions of the exposed surfaces unmasked; anodizing the unmasked surfaces; machining the portions of the exposed surfaces that were unmasked and which were anodized; unmasking the masked portions of the exposed surfaces; and forming a protective barrier on the exposed surfaces.

Any of the above methods may also optionally include machining anodized (or otherwise coated) surfaces that are not exposed surfaces (e.g., to obtain a bare metal connection where the machined surface will mate with another part).

It is another object of the present invention that the optical window deposition shield serves as an insert, wherein the insert comprises no optical through-holes and can be produced using any of the above methods.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

The present invention provides an improved optical window deposition shield for a plasma processing system to provide optical access to a process space through a deposition shield, wherein the design and fabrication of the optical window deposition shield advantageously addresses known shortcomings.

Figure 1:
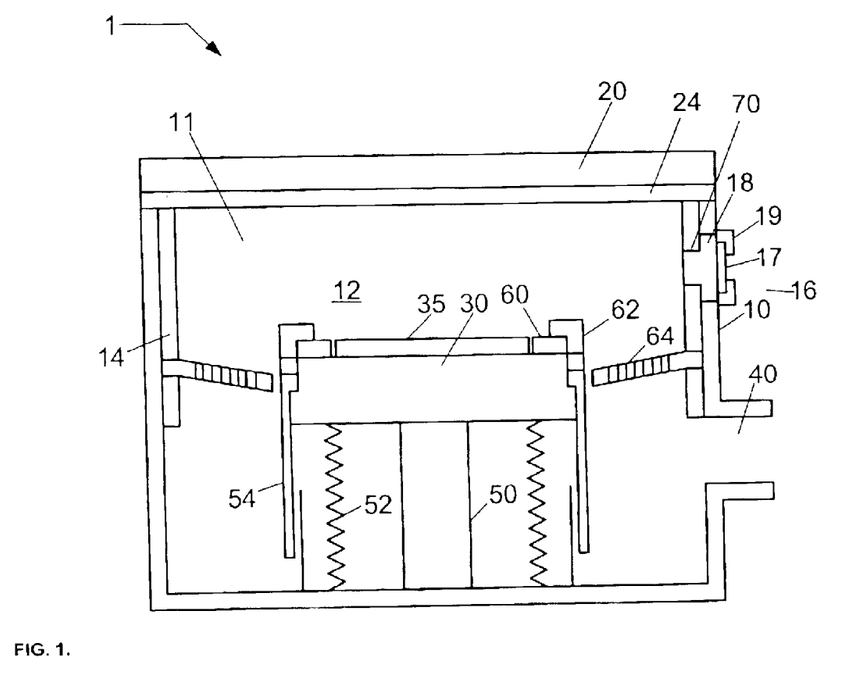
FIG. 1 shows a simplified block diagram of a plasma processing system comprising an optical window deposition shield according to an embodiment of the present invention.

According to an embodiment of the present invention, a plasma processing system 1 is depicted in FIG. 1 comprising a plasma processing chamber 10, an upper assembly 20, an electrode plate 24, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of a processing plasma in a process space 12 adjacent substrate 35. The plasma processing system 1 can be configured to process any substrate (e.g., 200 mm substrates, 300 mm substrates, or larger).

In the illustrated embodiment, upper assembly 20 can comprise at least one of a cover, a gas injection assembly, and an upper electrode impedance match network. For example, the electrode plate 24 can be coupled to an RF source. In another alternate embodiment, the upper assembly 20 comprises a cover and an electrode plate 24, wherein the electrode plate 24 is maintained at an electrical potential equivalent to that of the plasma processing chamber 10. For example, the plasma processing chamber 10, the upper assembly 20, and the electrode plate 24 can be electrically connected to ground potential.

Plasma processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can, for example, be coupled to the substrate holder 30 and configured to protect the bellows 52 from the processing plasma. Substrate holder 10 can, for example, further be coupled to at least one of a focus ring 60, and a shield ring 62. Furthermore, a baffle plate 64 can extend about a periphery of the substrate holder 30.

Substrate 35 can be, for example, transferred into and out of plasma processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermoelectric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2A:
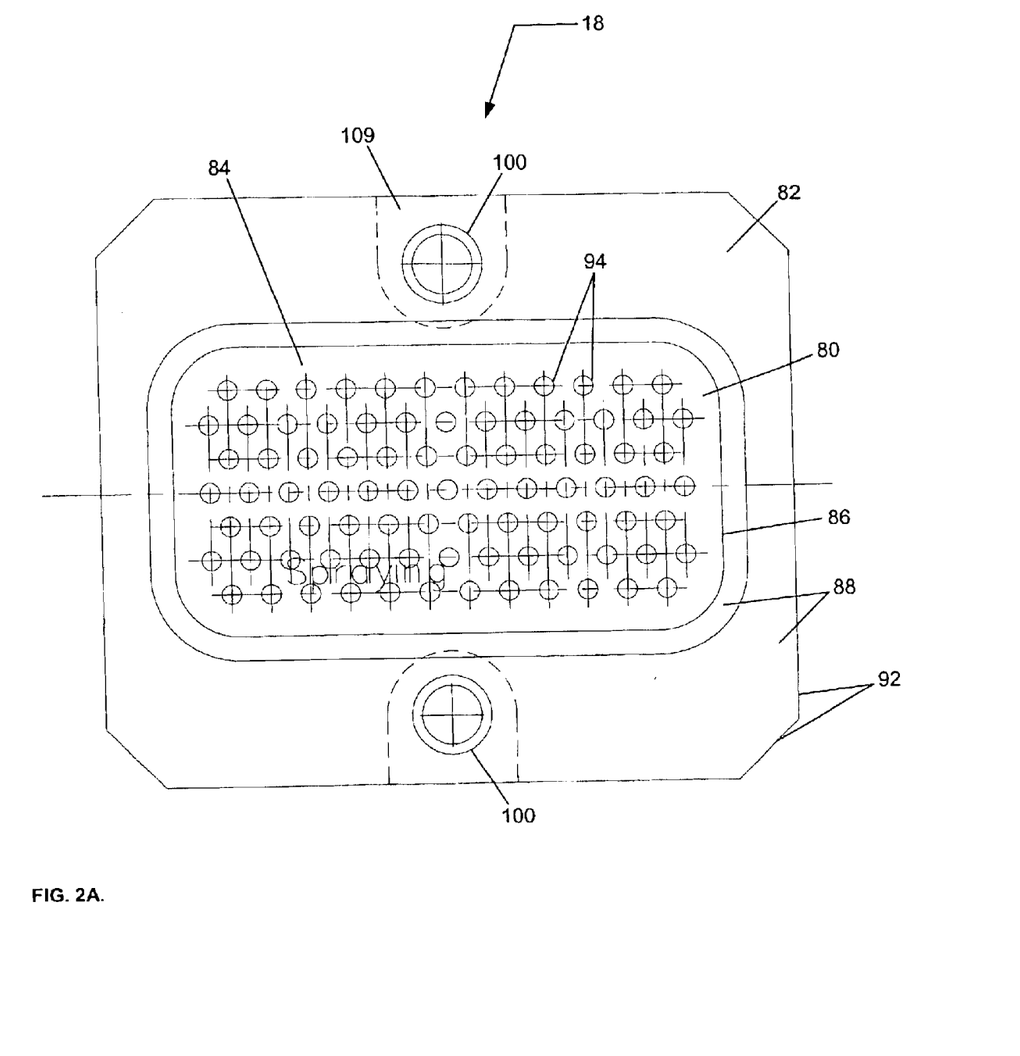
FIG. 2A shows a plan view of an optical window deposition shield for a plasma processing system according to an embodiment of the present invention.
Figure 3A:
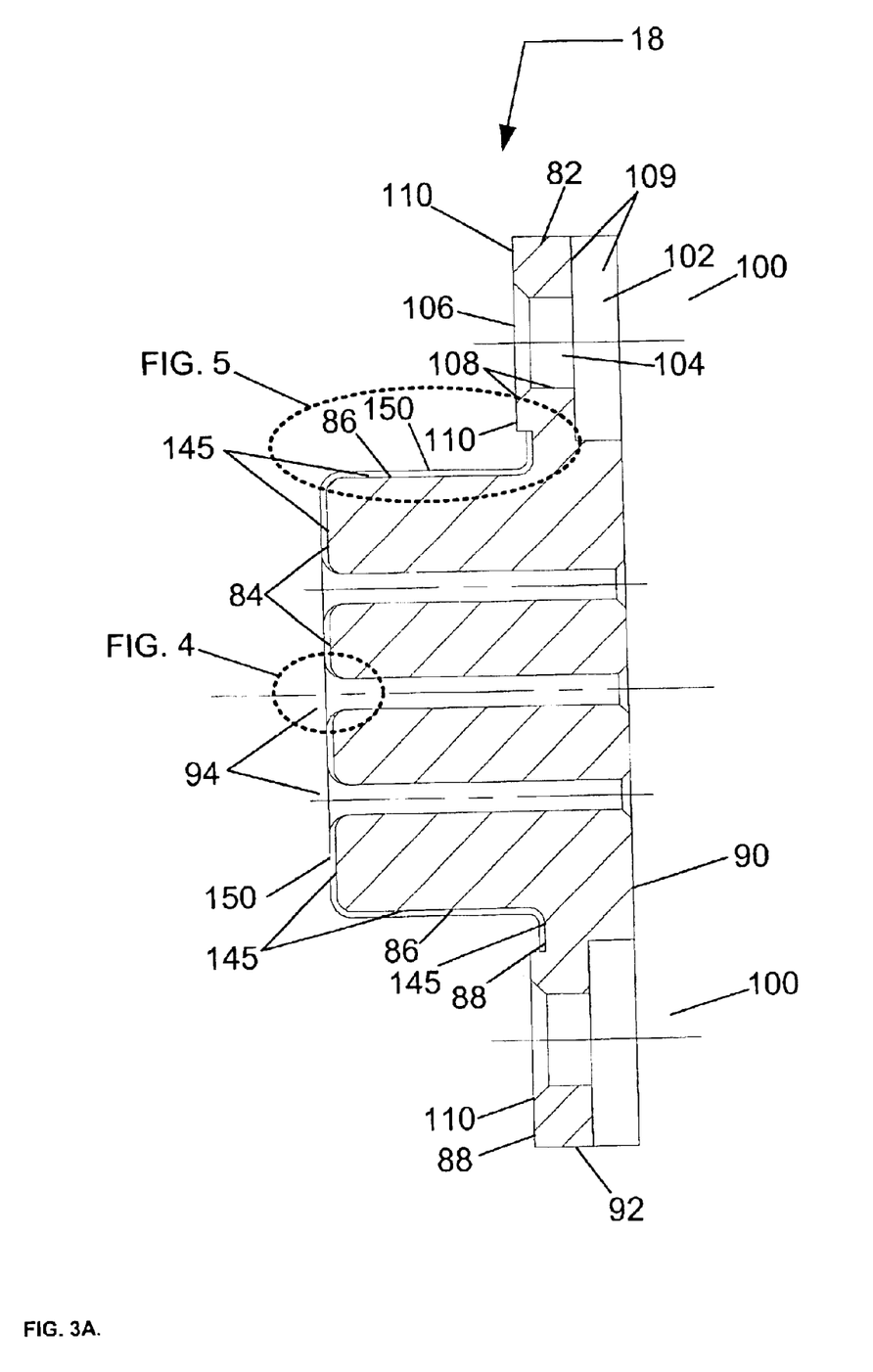
FIG. 3A shows a cross sectional view of an optical window deposition shield for a plasma processing system according to an embodiment of the present invention.

Referring now to an illustrated embodiment of the present invention depicted in FIGS. 2A (plan view) and 3A (cross sectional view), optical window deposition shield 18 comprises a plug 80 configured to extend through an opening in the deposition shield 14, and a flange 82 coupled to the plug 80 and configured to attach the optical window deposition shield 18 to the deposition shield 14. As shown in FIG. 3A, the plug 80 comprises a frontal surface 84 configured to face a processing plasma in the process space 12, and a perimeter surface 86 configured to mate with a first opening surface in the opening 70 (FIG. 1) of the deposition shield 14.

Additionally, the flange 82 comprises a first surface 88 coupled to the perimeter surface 86 of plug 80, a second surface 90, and an edge surface 92. Furthermore, for example, a width (along a major axis) of the plug 80 can range from 1 to 100 mm. Desirably, the width can range from 10 to 40 mm, and, preferably, the width is at least 25 mm. Furthermore, for example, a height (along a minor axis) of the plug 80 can range from 1 to 100 mm. Desirably, the height can range from 10 to 40 mm, and, preferably, the height is at least 15 mm.

With continuing reference to FIGS. 2A and 3A, the optical window deposition shield 18 can, for example, further include at least one optical through-hole 94 coupled to the frontal surface 84 of the plug 80 and to the second surface 90 of the flange 82, and configured to permit the passage of light to and/or from the process space 12.

Figure 4:
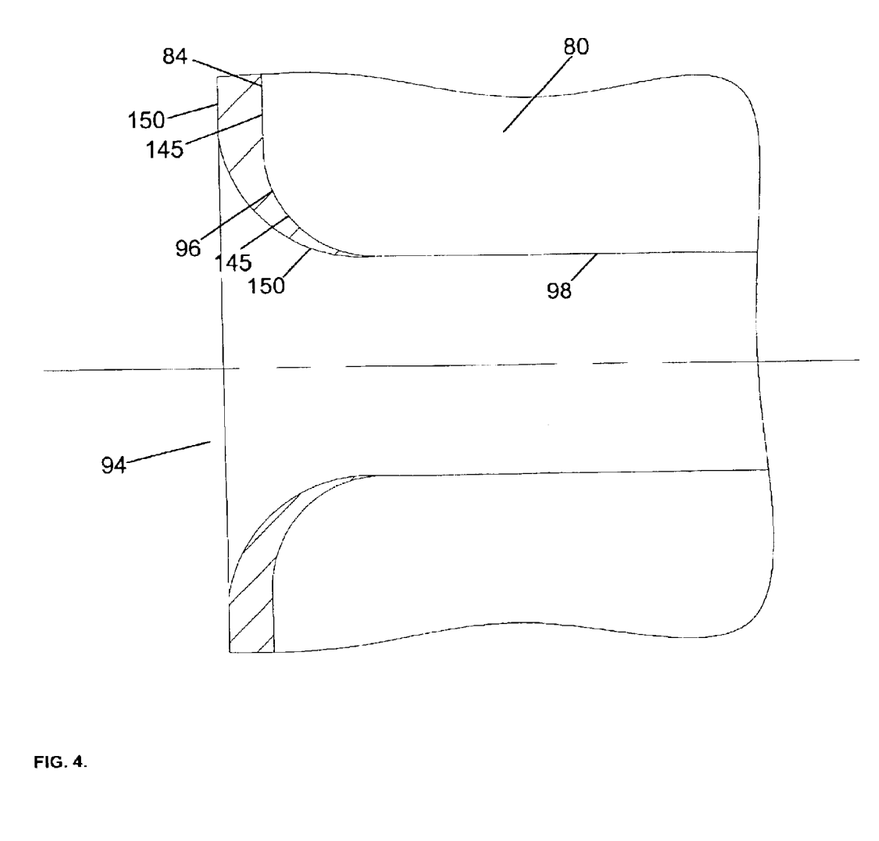
FIG. 4 shows an expanded cross sectional view of an optical through-hole for an optical window deposition shield in a plasma processing system according to an embodiment of the present invention.

FIG. 4 presents an expanded view of optical through-hole 94, wherein optical through-hole 94 comprises an exposed entrant surface 96 coupled to the frontal surface 84 of the plug 80, and an interior through-hole surface 98 coupled to the exposed entrant surface 96 and the second surface 90 of the flange 82. Furthermore, for example, a diameter of at least one optical through-hole 94 can range from 0.5 to 20 mm. Desirably, the diameter can range from 0.5 to 5 mm, and, preferably, the width is at least 0.5 mm. Furthermore, for example, the number of optical through-holes 94 can range from 1 to 500. Desirably, the number can range from 1 to 100, and, preferably, the number is at least 1.

Figure 2B:
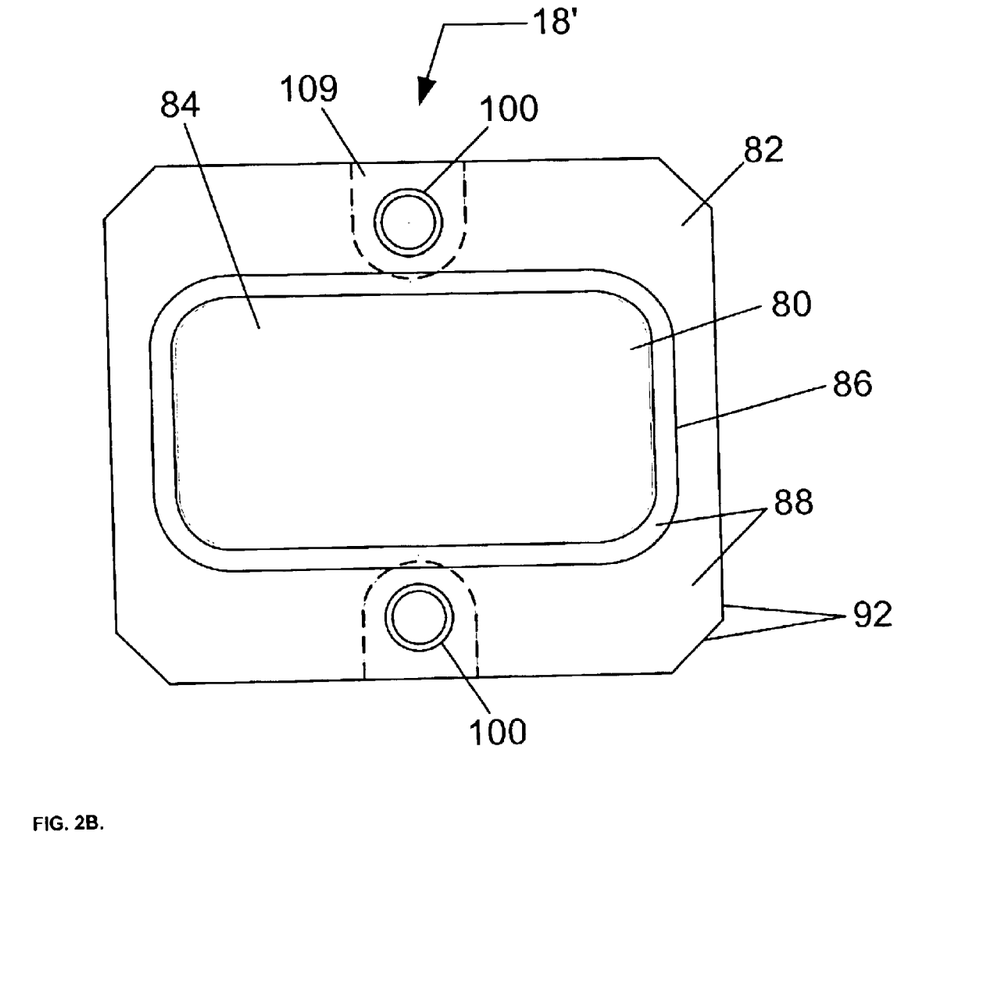
FIG. 2B shows a plan view of an insert for a plasma processing system according to an embodiment of the present invention.
Figure 3B:
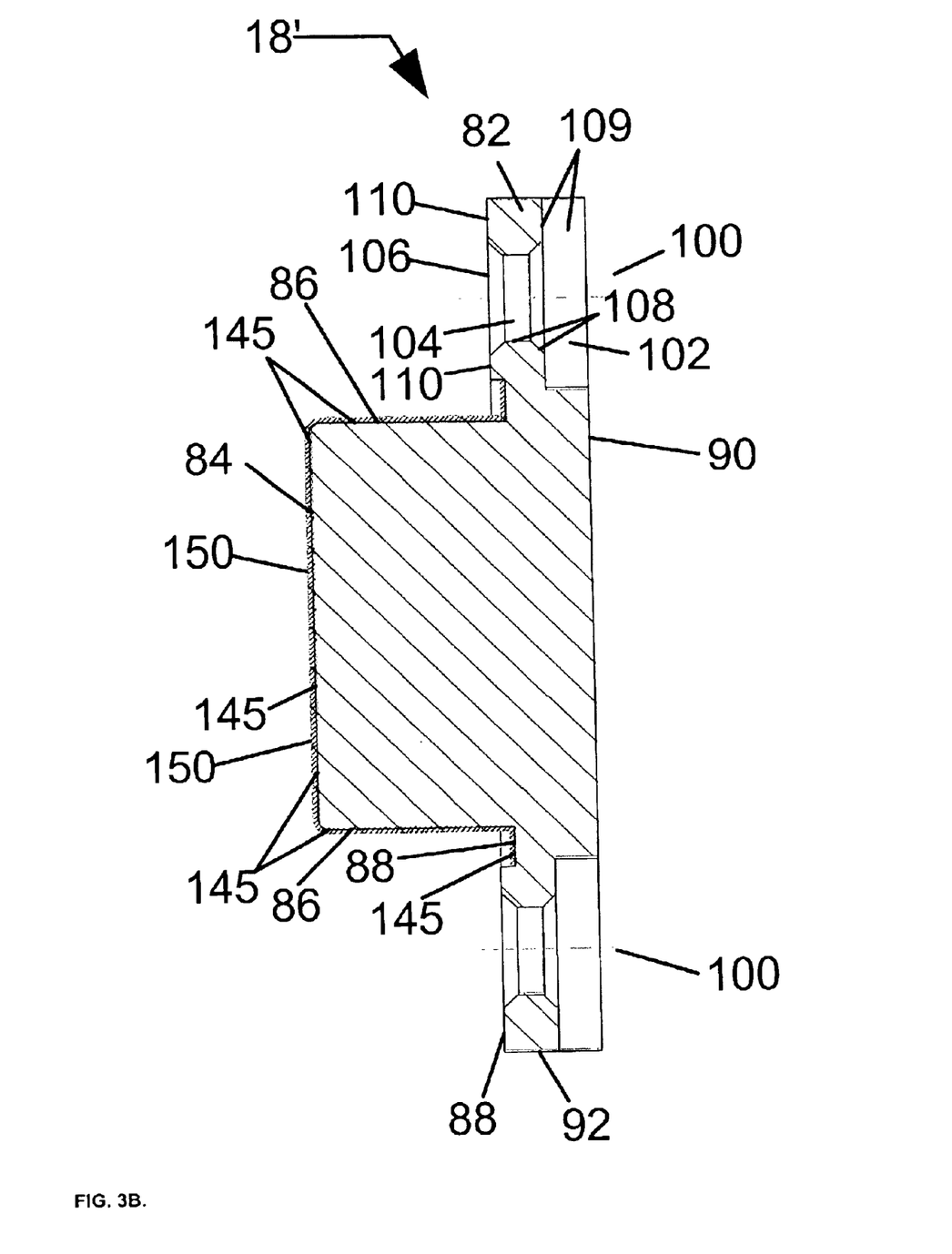
FIG. 3B shows a cross sectional view of an insert for a plasma processing system according to an embodiment of the present invention.

In an alternate embodiment, the optical window deposition shield 18 comprises no optical through-holes. In the illustrated embodiment as shown in FIGS. 2B (plan view) and 3B (cross-sectional view), the optical window deposition shield 18 serves as an insert 18' to fill the opening in the deposition shield 14 (i.e. optical access is not required for the specific process).

Referring to FIGS. 2A,B and 3A,B, flange 82 can, for example, further comprise a plurality of fastening receptors 100, each fastening receptor 100 coupled to the first surface 88 and the second surface 90 of the flange 82, and configured to receive fastening devices (not shown) (such as bolts) to couple optical window deposition shield 18 to deposition shield 14. The fastening receptors 100 can comprise an entrant region 102, a through-hole region 104, an exit through-hole 106, an interior fastener surface 108, and a recessed fastener surface 109. Furthermore, a portion of the first surface 88 of flange 82 can comprise a mating surface 110 configured to couple to a mating surface of the deposition shield 14 (FIG. 1). For example, the number of fastening receptors 100 formed within optical window deposition shield 18 can range from 0 to 100. Desirably, the number of fastening receptors 100 can range from 1 to 8; and, preferably, the number of fastening receptors 100 is at least 2 fastening receptors. For further details regarding the coupling of the optical window deposition shield 18 to the deposition shield 14, co-pending U.S. Patent application Ser. No. 10/XXX,XXX, entitled "Method and apparatus for an improved deposition shield in a plasma processing system", Attorney docket no. 226275US6YA, filed on even date herewith, is incorporated herein by reference in its entirety.

Figure 5:
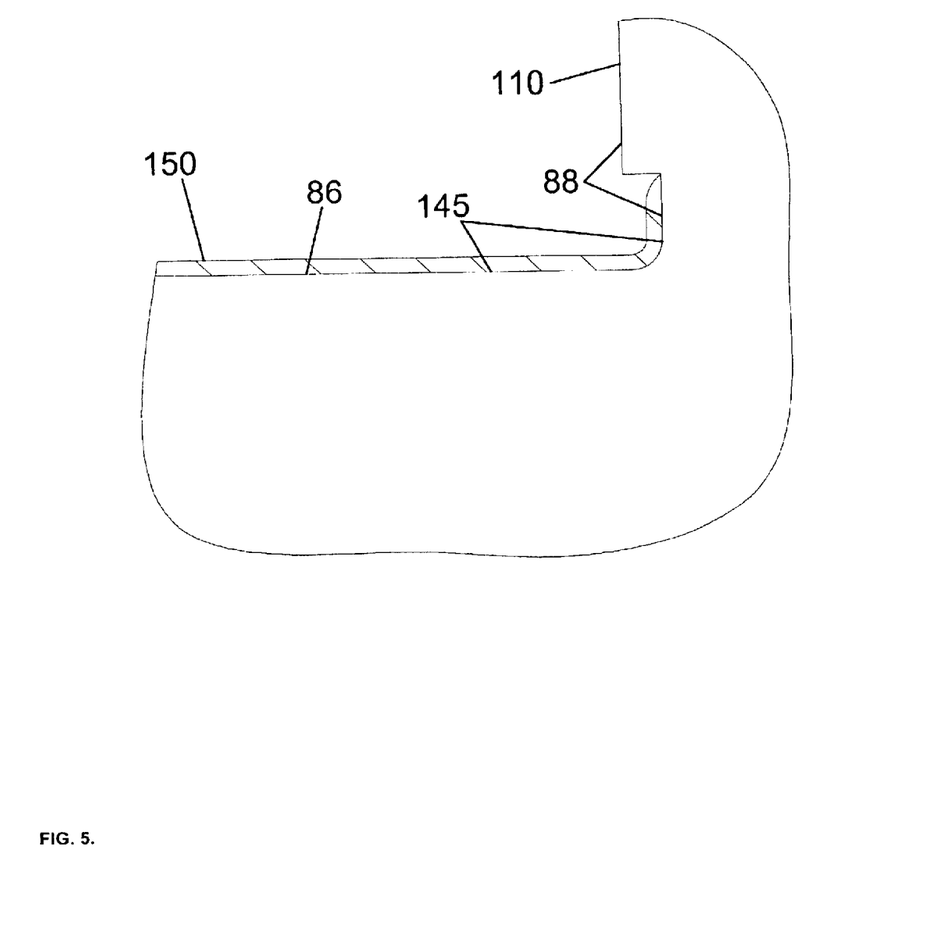
FIG. 5 shows an expanded view of a perimeter surface of a plug and a first surface of a flange for an optical window deposition shield in a plasma processing system according to an embodiment of the present invention.

FIG. 5 provides an expanded view of the perimeter surface 86 of the plug 80, and the first surface 88 of the flange 82, and the coupling therebetween.

Referring now to FIGS. 2 through 5, the optical window deposition shield 18 further comprises a protective barrier 150 formed on a plurality of exposed surfaces 145 of the optical window deposition shield 18. In an embodiment of the present invention, the exposed surfaces 145 can comprise the frontal surface 84 of the plug 80, the perimeter surface 86 of the plug 80, and the first surface 88 of the flange 82 excluding the mating surface 110. Additionally, the exposed surfaces 145 can comprise the exposed entrant surface 96 of the at least one optical through-hole 94. In an alternate embodiment, the exposed surfaces 145 can include mating surface 110.

In an embodiment of the present invention, the protective $O_3$ barrier 150 can comprise a compound including an oxide of aluminum such as $Al_2O_3$. In another embodiment of the present invention, the protective barrier 150 can comprise a mixture of $Al_2O_3$ and $Y_2O_3$. In another embodiment of the present invention, the protective barrier 150 can comprise at least one of a III-column element (i.e., column III of the periodic table) and a Lanthanon element. In another embodiment of the present invention, the III-column element can comprise at least one of Yttrium, Scandium, and Lanthanum. In another embodiment of the present invention, the Lanthanon element can comprise at least one of Cerium, Dysprosium, and Europium. In another embodiment of the present invention, the compound forming protective barrier 150 can comprise at least one of Yttria ($Y_2O_3$), $Sc_2O_3$, $Sc_2F_3$, $YF_3$, $La_2O_3$, $CeO_2$, $Eu_2O_3$, and $DyO_3$.

In an embodiment of the present invention, the protective barrier 150 formed on optical window deposition shield 18 can comprise a minimum thickness, wherein the minimum thickness can be specified as constant across at least one of the exposed surfaces 145. In another embodiment, the minimum thickness can be variable across the exposed surfaces 145. Alternately, the minimum thickness can be constant over a first portion of an exposed surface and variable over a second portion of an exposed surface. For example, a variable thickness can occur on a curved surface, on a corner, or in a hole. For example, the minimum thickness can range from 0.5 micron to 500 micron. Desirably, the minimum thickness can range from 5 micron to 200 micron, and, preferably, the minimum thickness is at least 5 micron.

Figure 6:
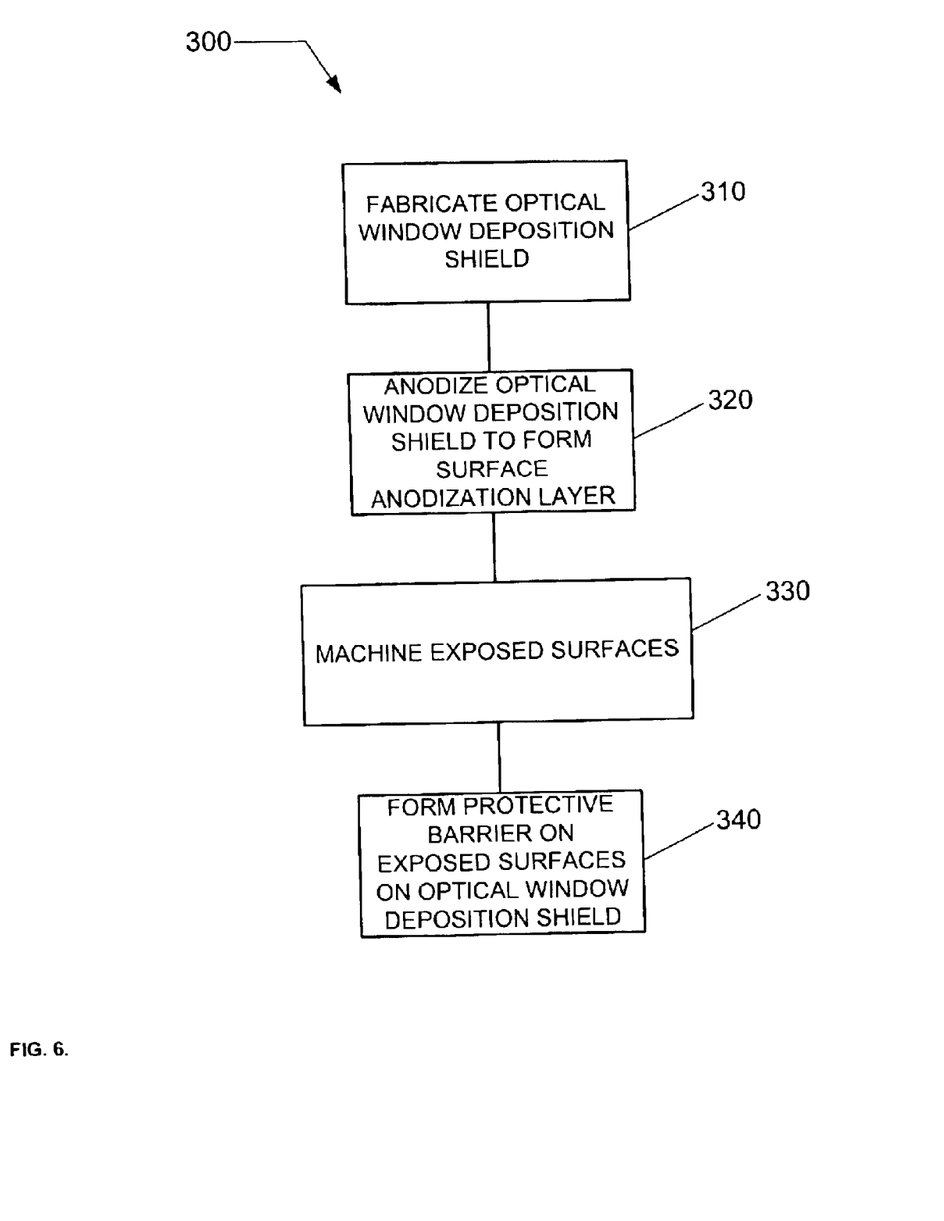
FIG. 6 presents a method of producing an optical window deposition shield for a plasma processing system according to an embodiment of the present invention.

FIG. 6 presents a method of producing the optical window deposition shield 18 for the plasma processing system 1 described in FIG. 1 according to an embodiment of the present invention. A flow diagram 300 begins in 310 with fabricating the optical window deposition shield 18 (as described above). Fabricating the optical window deposition shield comprises at least one of machining, casting, polishing, forging, and grinding. For example, elements of the optical window deposition shield 18 can be machined according to specifications set forth on a mechanical drawing, using conventional techniques including a mill, a lathe, etc. The techniques for machining a component using, for example, a mill or a lathe, are well known to those skilled in the art of machining. The optical window deposition shield 18 can, for example, be fabricated from aluminum.

In 320, the optical window deposition shield 18 is anodized to form a surface anodization layer. For example, when fabricating the optical window deposition shield 18 from aluminum, the surface anodization layer comprises aluminum oxide ($Al_2O_3$). Methods of anodizing aluminum components are well known to those skilled in the art of surface anodization.

In 330, exposed surfaces 145 on the anodized optical window deposition shield 18 are identified, and the surface anodization layer is removed from the exposed surfaces 145 using standard machining techniques. In an embodiment of the present invention, the exposed surfaces comprise the frontal surface of the plug, the perimeter surface of the plug, the first surface of the flange excluding the mating surface, and the exposed entrant surface of the at least one optical through-hole.

In 340, the protective barrier 150 (as described above) is formed on the exposed surfaces 145 identified in 330. A protective barrier comprising, for example Yttria, can be formed using (thermal) spray coating techniques that are well known to those skilled in the art of ceramic spray coatings. In an alternate embodiment, forming the protective barrier can further comprise polishing (or smoothing) the thermal spray coating. For example, polishing the thermal spray coating can comprise the application of sand paper to the sprayed surfaces.

Figure 7:
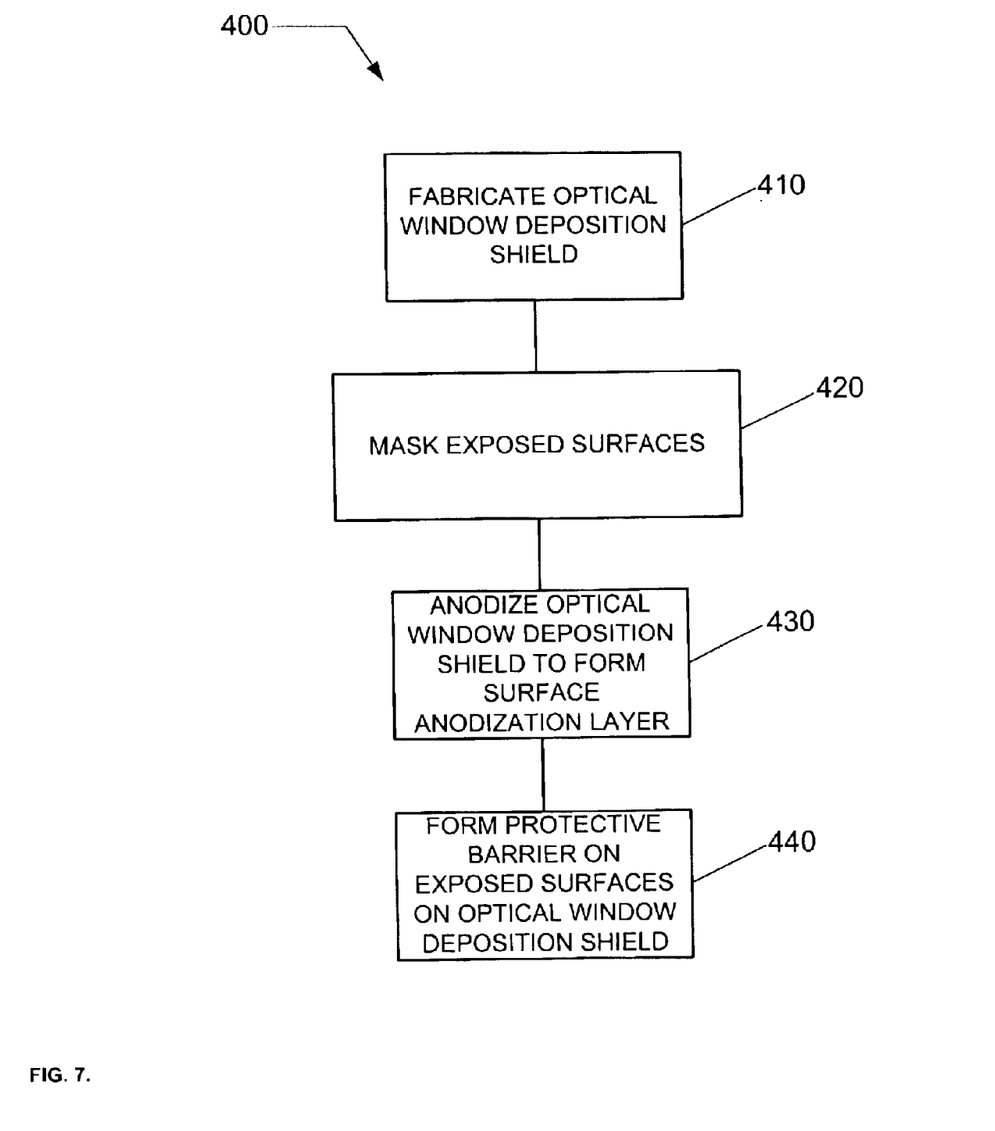
FIG. 7 presents a method of producing an optical window deposition shield for a plasma processing system according to another embodiment of the present invention.

FIG. 7 presents a method of producing the optical window deposition shield 18 in the plasma processing system 1 described in FIG. 1 according to another embodiment of the present invention. A flow diagram 400 begins in 410 with fabricating the optical window deposition shield 18 (as described above). Fabricating the optical window deposition shield 18 comprises at least one of machining, casting, polishing, forging, and grinding. For example, elements of the shield 18 can be machined according to specifications set forth on a mechanical drawing, using conventional techniques including a mill, a lathe, etc. The techniques for machining a component using, for example, a mill or a lathe, are well known to those skilled in the art of machining. The optical window deposition shield 18 can, for example, be fabricated from aluminum.

In 420, exposed surfaces 145 of the optical window deposition shield 18 are masked to prevent the formation of a surface anodization layer thereon. In an embodiment of the present invention, the exposed surfaces 145 comprise the frontal surface of the plug, the perimeter surface of the plug, the first surface of the flange excluding the mating surface, and the exposed entrant surface of the at least one optical through-hole. Techniques for surface masking and unmasking are well known to those skilled in the art of surface coatings and surface anodization.

In 430, the optical window deposition shield 18 is anodized to form a surface anodization layer on the remaining unmasked surfaces. For example, when fabricating the optical window deposition shield 18 from aluminum, the surface anodization layer can comprise aluminum oxide ($Al_2O_3$). Methods of anodizing aluminum components are well known to those skilled in the art of surface anodization.

In 440, the exposed surfaces 145 are unmasked, and a protective barrier 150 (as described above) is formed on the exposed surfaces 145. A protective barrier comprising, for example Yttria, can be formed using (thermal) spray coating techniques that are well known to those skilled in the art of ceramic spray coatings. In an alternate embodiment, forming the protective barrier 150 can further comprise polishing (or smoothing) the thermal spray coating. For example, polishing the thermal spray coating can comprise the application of sand paper to the sprayed surfaces.

Figure 8:
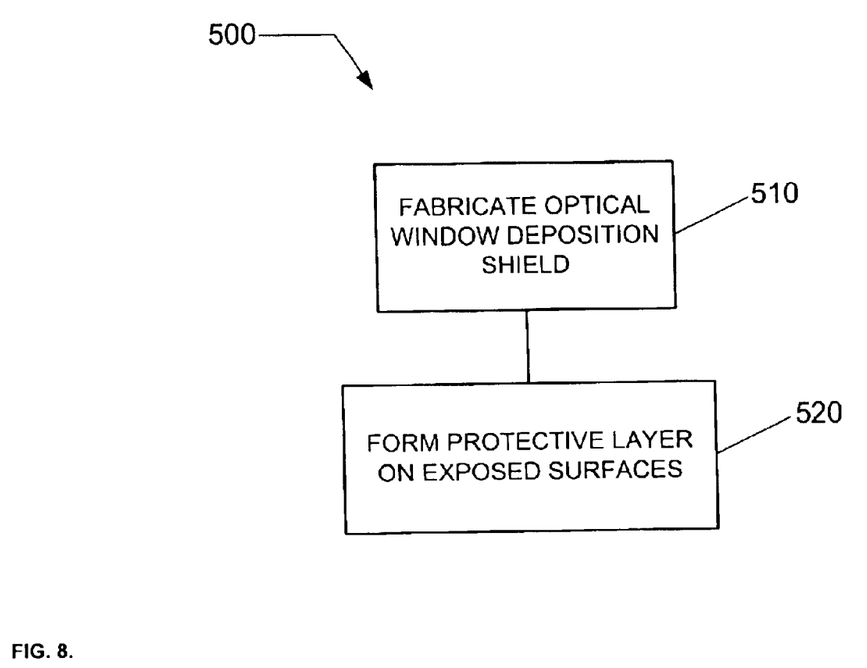
FIG. 8 presents a method of producing an optical window deposition shield for a plasma processing system according to another embodiment of the present invention.

FIG. 8 presents a method of producing the optical window deposition shield 18 in the plasma processing system 1 described in FIG. 1 according to another embodiment of the present invention. A flow diagram 500 begins in 510 with fabricating the optical window deposition shield 18 (as described above). Fabricating the optical window deposition shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The optical window deposition shield 18 can, for example, be fabricated from aluminum.

In 520, a protective barrier 150 (as described above) is formed on exposed surfaces 145 of the optical window deposition shield 18. In an embodiment of the present invention, the exposed surfaces comprise the frontal surface of the plug, the perimeter surface of the plug, the first surface of the flange excluding the mating surface, and the exposed entrant surface of the at least one optical through-hole. In another embodiment of the present invention, the exposed surfaces comprise all surfaces on the optical window deposition shield 18. A protective barrier comprising, for example Yttria, can be formed using (thermal) spray coating techniques that are well known to those skilled in the art of ceramic spray coatings. In an alternate embodiment, forming the protective barrier can further comprise polishing (or smoothing) the thermal spray coating. For example, polishing the thermal spray coating can comprise the application of sand paper to the sprayed surfaces.

The present invention also includes another method that combines masking portions of the exposed surfaces before anodization and leaving other portions of the exposed surfaces unmasked; anodizing the unmasked surfaces; machining the portions of the exposed surfaces that were unmasked and which were anodized; unmasking the masked portions of the exposed surfaces; and forming a protective barrier on the exposed surfaces.

Any of the above methods may also optionally include machining anodized (or otherwise coated) surfaces that are not exposed surfaces (e.g., to obtain a bare metal connection where the machined surface will mate with another part).

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. An optical window deposition shield for accessing a process space through a deposition shield in a plasma processing system comprising:
   a plug configured to provide optical access through said deposition shield, said plug comprises a frontal surface and a perimeter surface;
   a flange coupled to said plug and configured to couple said optical window deposition shield to at least one of the deposition shield and a chamber wall of the plasma processing system, said flange comprising a first surface, a second surface, and an edge surface, wherein a portion of said first surface comprises a mating surface; and
   a protective barrier coupled to a plurality of exposed surfaces of said optical window deposition shield, wherein the plurality of exposed surfaces comprise said frontal surface of said plug, said perimeter surface of said plug, and said first surface of said flange excluding said mating surface.

2. The optical window deposition shield as recited in claim 1, wherein said optical window deposition shield comprises a plurality of fastening receptors coupled to said first surface of said flange and said second surface of said flange and configured to receive fastening devices in order to couple said optical window deposition shield to the at least one of the deposition shield and the chamber wall.

3. The optical window deposition shield as recited in claim 2, wherein each of said plurality of fastening receptors comprises an entrant region, a through-hole region, an exit through-hole, an interior fastener surface, and a recessed fastener surface.

4. The optical window deposition shield as recited in claim 1, wherein said optical window deposition shield further comprises at least one optical through-hole coupled to said frontal surface of said plug and said second surface of said flange, and configured to couple light through said optical window deposition shield.

5. The optical window deposition shield as recited in claim 4, wherein said each of said at least one optical through-hole comprises an exposed entrant surface and an interior through-hole surface.

6. The optical window deposition shield as recited in claim 5, wherein the plurality of exposed surfaces further comprise said exposed entrant surface of at least one of the at least one optical through-hole.

7. The optical window deposition shield as recited in claim 1, wherein said second surface comprises an anodization layer.

8. The optical window deposition shield as recited in claim 1, wherein said edge surface comprises an anodization layer.

9. The optical window deposition shield as recited in claim 1, wherein said protective barrier comprises a compound containing at least one of a III-column element and a Lanthanon element.

10. The optical window deposition shield as recited in claim 9, wherein said III-column element comprises at least one of Yttrium, Scandium, and Lanthanum.

11. The optical window deposition shield as recited in claim 9, wherein said Lanthanon element comprises at least one of Cerium, Dysprosium, and Europium.

12. The optical window deposition shield as recited in claim 1, wherein said protective barrier comprises at least one of $Y_2O_3$, $Sc_2O_3$, $Sc_2F_3$, $YF_3$, $La_2O_3$, $CeO_2$, $Eu_2O_3$, and $DyO_3$.

13. The optical window deposition shield as recited in claim 1, wherein said protective barrier comprises a minimum thickness and said minimum thickness is constant across at least one of the plurality of exposed surfaces.

14. The improved optical window deposition shield as recited in claim 1, wherein said protective barrier comprises a variable thickness and said variable thickness ranging from 0.5 to 500 microns.

15. The improved optical window deposition shield as recited in claim 1, wherein said plurality of exposed surfaces further comprises said mating surface.

16. The improved optical window deposition shield as recited in claim 1, wherein said optical window deposition shield comprises a metal.

17. The improved optical window deposition shield as recited in claim 16, wherein said metal comprises aluminum.

18. The improved optical window deposition shield as recited in claim 1, wherein said optical window deposition shield comprises a rectangular shape.

19. The improved optical window deposition shield as recited in claim 1, wherein said mating surface comprises a metallic surface.

20. A method of producing an optical window deposition shield for a deposition shield in a plasma processing system, said method comprising:
    fabricating said optical window deposition shield, wherein said optical window deposition shield comprises a plug configured to provide optical access through said deposition shield, said plug comprises a frontal surface and a perimeter surface, and a flange coupled to said plug and configured to couple said optical window deposition shield to at least one of the deposition shield and a chamber wall of the plasma processing system, said flange comprising a first surface, a second surface, and an edge surface, wherein a portion of said first surface comprises a mating surface; and forming a protective barrier on exposed surfaces, wherein said exposed surfaces comprise said frontal surface of said insert, said perimeter surface of said insert, and said first surface of said flange excluding said mating surface.

21. The method as recited in claim 20, said method further comprising:

anodizing said optical window deposition shield to form a surface anodization layer on said optical window deposition shield; and removing said surface anodization layer on said exposed surfaces.

22. The method as recited in claim 21, wherein said removing comprises at least one of machining, smoothing, polishing, and grinding.

23. The method as recited in claim 20, said method further comprising:

masking said exposed surfaces on said optical window deposition shield to prevent formation of a surface anodization layer;

anodizing said optical window deposition shield to form a surface anodization layer on the unmasked surfaces of said optical window deposition shield; and unmasking said exposed surfaces.

24. The method as recited in claim 20, wherein said fabricating comprises at least one of machining, coating, masking, unmasking, casting, polishing, forging, and grinding.

25. The method as recited in claim 20, wherein said forming comprises at least one of spraying, heating, and cooling.

26. The method as recited in claim 20, said method further comprising smoothing said protective barrier.

27. The method as recited in claim 20, wherein said optical window deposition shield comprises a plurality of fastening receptors coupled to said first surface of said flange and said second surface of said flange and configured to receive fastening devices in order to couple said optical window deposition shield to the at least one of the deposition shield and the chamber wall.

28. The method as recited in claim 27, wherein each of said plurality of fastening receptors comprises an entrant region, an entrant cavity, an exit through-hole, an interior fastener surface, and a recessed fastener surface.

29. The method as recited in claim 20, wherein said plurality of exposed surfaces further comprises said mating surface.

30. The method as recited in claim 20, wherein said optical window deposition shield comprises a metal.

31. The method as recited in claim 30, wherein said metal comprises aluminum.

32. The method as recited in claim 20, wherein said optical window deposition shield comprises a rectangular shape.

33. The method as recited in claim 20, wherein said second surface comprises an anodization layer.

34. The method as recited in claim 20, wherein said edge surface comprises an anodization layer.

35. The method as recited in claim 20, wherein said protective barrier comprises a compound containing at least one of a III-column element and a Lanthanon element.

36. The method as recited in claim 35, wherein said III-column element comprises at least one of Yttrium, Scandium, and Lanthanum.

37. The method as recited in claim 35, wherein said Lanthanon element comprises at least one of Cerium, Dysprosium, and Europium.

38. The method as recited in claim 20, wherein said protective barrier comprises at least one of $Y_2O_3$, $Sc_2O_3$, $Sc_2F_3$, $YF_3$, $La_2O_3$, $CeO_2$, $Eu_2O_3$, and $DyO_3$.

39. The method as recited in claim 20, wherein said protective barrier comprises a minimum thickness and said minimum thickness is constant across at least one of said exposed surfaces.

40. The method as recited in claim 20, wherein said protective barrier comprises a variable thickness and said variable thickness ranging from 0.5 to 500 microns.

* * * * *

UNITED STATES PATENT AND TRADEMARK OFFICE
CERTIFICATE OF CORRECTION

PATENT NO. : 6,798,519 B2  Page 1 of 1
APPLICATION NO. : 10/259352
DATED : September 28, 2004
INVENTOR(S) : Shinya Nishimoto et al.

It is certified that error appears in the above-identified patent and that said Letters Patent is hereby corrected as shown below:

Change in Column 7, line 24, "$DyO_3$" to --$Dy_2O_3$--.
Change in Column 10, line 41, "$DyO_3$" to --$Dy_2O_3$--.
Change in Column 12, line 35, "$DyO_3$" to --$Dy_2O_3$--.

Signed and Sealed this

Twenty-third Day of June, 2009

JOHN DOLL
*Acting Director of the United States Patent and Trademark Office*